(12) United States Patent
Wang (10) Patent No.: US 9,432,090 B2
(45) Date of Patent: Aug. 30, 2016

(54) WIRELESS POWER TRANSMISSION SYSTEM

(71) Applicant: Lockheed Martin Corporation, Bethesda, MD (US)

(72) Inventor: Li Leah Wang, Fremont, CA (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 593 days.

(21) Appl. No.: 13/888,301

(22) Filed: May 6, 2013

(65) Prior Publication Data

US 2013/0300207 A1    Nov. 14, 2013

Related U.S. Application Data

(60) Provisional application No. 61/644,338, filed on May 8, 2012.

(51) Int. Cl.
  *H01F 27/42*    (2006.01)
  *H04B 5/00*    (2006.01)
  *B81B 7/00*    (2006.01)

(52) U.S. Cl.
  CPC .............. *H04B 5/0037* (2013.01); *B81B 7/00* (2013.01); *H04B 5/0087* (2013.01); *B81B 2201/00* (2013.01)

(58) Field of Classification Search
  CPC ...... H02J 17/00; B81B 2201/00; B81B 7/00; H04B 5/0037
  See application file for complete search history.

(56) References Cited

U.S. PATENT DOCUMENTS

| | | | | |
|---|---|---|---|---|
| 6,427,065 B1* | 7/2002 | Suga | .................... | G06K 7/0008 235/492 |
| 8,471,411 B2* | 6/2013 | Urano | .................... | H02J 5/005 307/104 |
| 2009/0243397 A1* | 10/2009 | Cook | .................... | H02J 5/005 307/104 |
| 2009/0262766 A1* | 10/2009 | Chen | .................... | H03C 7/027 372/26 |
| 2011/0051312 A1* | 3/2011 | Steeneken | ............. | B81B 3/0078 361/281 |
| 2012/0043887 A1* | 2/2012 | Mesibov | ................. | H01F 38/14 315/76 |
| 2014/0076697 A1* | 3/2014 | Gupta | .................... | B81B 3/001 200/181 |

OTHER PUBLICATIONS

Huang, Da, et al. "Magnetic superlens-enhanced inductive coupling for wireless power transfer." Journal of Applied Physics 111.6 (2012): 064902.*

* cited by examiner

*Primary Examiner* — Daniel Cavallari
(74) *Attorney, Agent, or Firm* — McDermott Will & Emery LLP (57) ABSTRACT

Various aspects of the subject technology include a wireless power transmission design based on extended range near-field resonance coupling induction, where magnetic near-field range may be extended by several orders of magnitude. One element that may help to accomplish the near-field extension, in one aspect, is the addition of a transformational magnetic lens to the transmitter. The magnetic lens may be made of metamaterials with refractive index of for example, −1. It may recover and collimate the near-field evanescent, magnetic flux, effectively extending the near-field coupling distance by several orders of magnitude.

18 Claims, 11 Drawing Sheets

FIG. 4B
Receiver 450

FIG. 4A
Transmitter 400

WIRELESS POWER TRANSMISSION SYSTEM

CROSS-REFERENCE TO RELATED APPLICATIONS

This application claims the benefit of priority under 35 USC. §119 from U.S. Provisional Patent Application 61/644,338 filed May 8, 2012, which is incorporated herein by reference in its entirety.

STATEMENT REGARDING FEDERALLY SPONSORED RESEARCH OR DEVELOPMENT

Not applicable.

FIELD

The present invention generally relates to energy transfer and, in particular, to wireless power transmission.

BACKGROUND

The use of powered devices, such as portable or mobile electronic devices, are becoming more and more common place. However these devices typically require a wired charger and power source which may be cumbersome, inflexible, and inconvenient. Wireless power transmission (WPT) can displace current cable based power distribution systems.

Wireless power transfer technologies are particularly critical, to military and defense applications in light of the increased use of critical portable electronics on the battlefield and the advent of distributed wireless sensors. For example, warfighters on single-day missions may carry anywhere from five to ten pounds of batteries of various form factors to maintain functionality of critical gear. For space applications, wireless power transfer capabilities becomes even more important for powering constellations of satellites while saving weight and allowing for fractionated architectures.

SUMMARY

Various aspects of the subject technology relate to a system for wireless power transmission. The system may include a source coil configured to convert power provided by a power source into a magnetic field, a metamaterial magnetic lens, and at least one transmit coil, coupled to the source coil, configured to transmit the magnetic field through the metamaterial magnetic lens, wherein the magnetic field exhibits a magnetic flux. The metamaterial magnetic lens is configured to collimate the magnetic flux of the magnetic field emitted by the at least one transmit coil towards a receiver of a load.

Aspects of the subject technology may also relate to a method for wirelessly transmitting power. The method may include transmitting power from a source through a source coil configured to convert the power provided by the power source into a magnetic field, converting, at the source coil, the power into a magnetic field, and using a transmit coil to transmit the magnetic field through a metamaterial magnetic lens. The magnetic field is transmitted at a resonance frequency of the transmit coil and the resonance frequency of the transmit coil is configured to correspond to that of a receive coil and the metamaterial magnetic lens is configured to collimate the magnetic field emitted by the transmit coil towards the receiver coil.

Aspects may further relate to a system for wireless power transmission. The system may include a source coil configured to convert the electrical energy into a magnetic field, a transmit coil, coupled to the source coil, configured to transmit the magnetic field wherein the magnetic field exhibits a magnetic flux, and a metamaterial magnetic lens comprises a plurality of unit cell structures, wherein the metamaterial magnetic lens is configured to collimate the magnetic flux of the magnetic field emitted by the at least one transmit coil.

The foregoing has outlined rather broadly the features of the present disclosure in order that the detailed description that follows can be better understood. Additional features and advantages of the disclosure will be described hereinafter. These and other advantages and features will become more apparent from the following description taken in conjunction with the drawings.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure.

DETAILED DESCRIPTION

Wireless power transmission technologies may be implemented in a number of ways. For example a laser beaming technique may be used where power is wirelessly transported by laser beams between a source transmitter and a receiver. Photodetectors are used to convert electrical power to optical laser power at the transmitter end and to convert the optical laser power to electrical power at the receiver end. However, the efficiency of the power transfer is limited by the loss of power of the laser beam over long distances in the atmosphere, the electrical wall plug efficiency of the lasers, as well, as the optical-to-electrical conversion efficiency of the photodetectors. Furthermore, the source transmitter and the receiver may need to share a line-of-sight to operate sufficiently. Accordingly, the technique is more suitable for applications where few obstacles exist (e.g., for space applications). For terrestrial application, the laser beam technique may be difficult to implement in certain applications because there may be a number of anticipated blockages from obstacles (e.g., from human, vehicles, buildings, terrain, etc.) and laser beam safety may raise additional concerns.

Another technique may transfer power by using, as pair of antennas, a transmit antenna and a receive antenna, similar to wireless data transmission systems. ° These antennas may be isotropic or directional. For isotropic antennas which transmit radio waves in all directions, the power transmission efficiency may be limited by loss of signal strength due to high free-space path loss (FSPL). The use of directional antennas may be limited to applications where a line-of-sight is available and persistent, which may not be ideal for populated areas with many obstacles that may block transmission.

Wireless power transmission may also be accomplished using induction techniques based on non-resonance coils, one or more transmitting coils and one or more receiving coils. Magnetic field coupling in the form of evanescent fields between the two coils enables power transfer between the two coils. However, the magnetic coupling can be weak when the two coils operate at off-resonances or at different resonance frequencies. The induction techniques may also suffer significant efficiency drop-offs as a function of the transmission distance between the two coils ($\sim d^{-3}$) because of the decay of the near-field evanescent magnetic field. Furthermore, the coils needed to implement these techniques may be prohibitively large and bulky.

According to various aspects of the subject technology, a near-field resonance coupling technique is disclosed that improves efficiency and extends the transfer distance. For example, one aspect of the technique may address those challenges and realize a very compact and lightweight system with wall-to-load conversion efficiency over 50% at over 5 meters of transmission distance. Various aspects of the subject technology may use a transformational magnetic lens to recover and collimate the near-field evanescent magnetic flux, effectively extending the near-field distance by several orders of magnitude. By doing so, the transmission efficiency may be enhanced and the required coil size may be reduced. The magnetic lens may be made of metamaterials with refractive index of, for example, −1. According to one aspect, it can be implemented in the form of split-ring resonators or other forms.

Various aspects of the subject technology may also be implemented on printed circuit board (PCB) technology and, thus, may be compatible with mobile electronic devices. Platforms on other substrates may also be used. Implementations may utilize microelectromechanical systems (MEMs), which may include MEM switchable resistors and MEM varactors (e.g., variable capacitance diodes or varicaps) to enable improved matching, of frequency and impedance between transmitter and receiver.

The designs that implement aspects of the subject technology may also be scalable and may have multiple transmission channels to simultaneously power multiple devices either in pulsed mode or continuous mode. Some designs may be well suited for mobile power distribution systems for both military and commercial applications. Some designs may also be a practical wireless power distribution infrastructure for cell phones, electric cars, and other mobile devices.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Figure 1A:
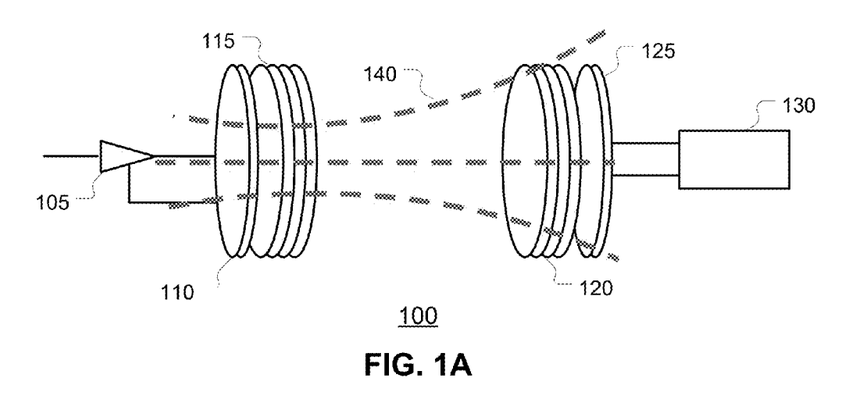
FIG. 1A is a block diagram illustrating an example wireless power transmission system.

FIG. 1A is a block diagram illustrating an example wireless power transmission system 100. The wireless power transmission system 100 includes a transmitting end and a receiving end. The transmitting end may include a source 105, a source coil 110, and a transmit coil 115 while the receiving end may include a receive coil 120, a load coil 125, and a load 130. The source 105 may be a power supply configured to supply power in a particular form (e.g., electric power). The source 105 may include, for example, a battery, a fuel cell, a generator, an electrical outlet, or other power supply. The source coil 110 is configured to transform the power supplied by the source 105 into a different form. For example, the source coil 110 may transform electric power from the source 105 into magnetic energy (e.g., a magnetic resonance field 140) which may be transmitted or otherwise modified by the transmit coil 115. For example, the transmit coil 115 may be configured to transmit the energy at a particular frequency that will correspond to one or more receive coils 120.

A receiver coil 120 is configured to receive the magnetic energy at the frequency transmitted by the transmit coil 115 and provide the magnetic energy to the load coil 125. The load coil 125 will convert the magnetic energy back to electrical power that the load 130 may use. The load may be any device, machine, or apparatus that may be powered by power supplied by the source 105. Examples may include mobile devices (e.g., GPS devices, mobile phones or other communication devices, tablets, etc.), computers, vehicles, or any other machine or device that can use electrical power.

The intensity of the evanescence of the magnetic field emitted by the transmit coil 115 that exhibits an exponential rate of decay with respect to the distance of a transmitter. Accordingly, the distance between the transmitting end and the receiving end of the wireless power transmission system 100 may be limited. Furthermore, the transmitting end and the receiving end may experience resonance frequency mismatches and/or impedance mismatches.

Figure 1B:
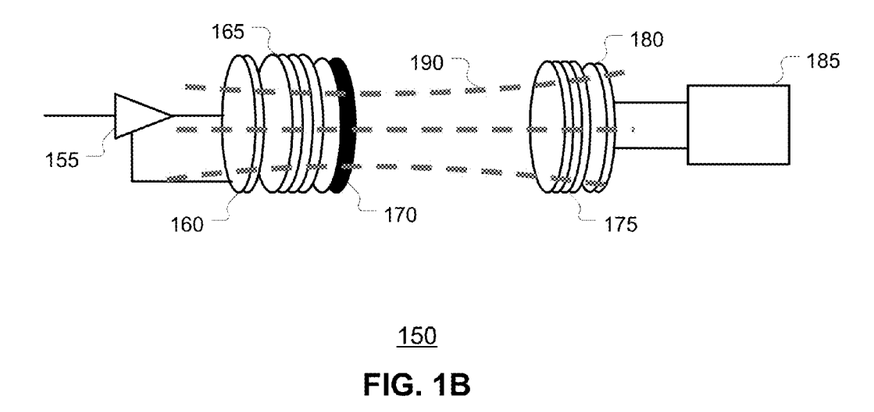
FIG. 1B is a block diagram illustrating an example wireless power transmission system, in accordance with various aspects of the subject technology.

Various aspects of the subject technology are configured to recover evanescent magnetic fields, enable stronger coupling of the transmitting, end and the receiving end of a wireless power transmission system, and allow the transmitting end and the receiving end to operate at extended distances. Additionally, aspects of the subject technology allow for frequency and impedance tuning to more precisely match the resonance frequencies and impedances between the transmitting end and the receiving, end to further improve efficiency. FIG. 1B provides an example of how some aspects of the subject technology are capable of improving wireless power transmission.

FIG. 1B is a block diagram illustrating an example wireless power transmission system 150, in accordance with various aspects of the subject technology. The wireless power transmission system 150 includes a transmitting end and a receiving, end. The transmitting end may include a source 155, a source coil 160, a transmit coil 165, and a magnetic lens 170 while the receiving end may include a receive coil 175, a load coil 180, and a load 185.

According to some aspects, the source coil 160 may include one or more MEM switchable resistors and the transmit coil 165 may be a helical coil incorporating MEM varactors. The receive coil 175 may also be helical. According to some aspects, the source coil 160, the transmit coil 165, and the magnetic lens 170 may be integrated together on a multilayer PCB to form a transmitter assembly. Similarly, the receive coil 175 and the load coil 180 may be integrated together to another multilayer PCB to form a receiver assembly.

As in the example above, the source coil 160 may transform the power supplied by the source 155 into magnetic energy (e.g., a magnetic resonance field 190) which may be emitted by the transmit coil 165. The MEM switchable resistors of the source coil 160 may be configured to provide impedance matching between source 155 and load 160. Because each load 160 (e.g., each device powered by the source 155) may have different load characteristics, tuning the source impedance to match that of the load impedance may improve the transmission efficiency and allow the wireless power transmission system 150 to accommodate a variety of devices.

The MEM varactors of the transmit coil 165 may be configured to provide parasitic capacitance next to the helical coil of the transmit coil 165 to precisely tune its resonance frequency. Frequency tuning may be used to precisely match the resonance frequencies between the transmitting end and the receiving end. For example, in the presence of ambient interferences that can cause frequency shifts to either the transmitter and/or the receiver, frequency timing may be used to more precisely match the transmitter and the receiver. In addition, frequency tuning may be used for on-demand multi-channel operations.

The magnetic lens 170 may be composed of metamaterial (e.g., split-ring resonators) configured to have a refractive index of, for example, −1. The metamaterial lens may further be configured to recover the evanescent field as well as collimate the magnetic flux emitted from the transmitting end. By doing so, the magnetic lens is able to extend the transmission distance between the transmitting end and the receiving end and reduce the size of the coils used. FIG. 1A and FIG. 1B help to illustrate the difference that the magnetic lens may make in magnetic flux propagation. As seen in FIG. 1B, the evanescent field is recovered and collimated compared to the evanescent field shown in FIG. 1A. Accordingly, stronger coupling between the transmitting end and the receiving end may exist, the distance between the transmitting end and the receiving end may be extended, and the size of the coils used in the transmitting end and the receiving end may be reduced.

Figure 1C:
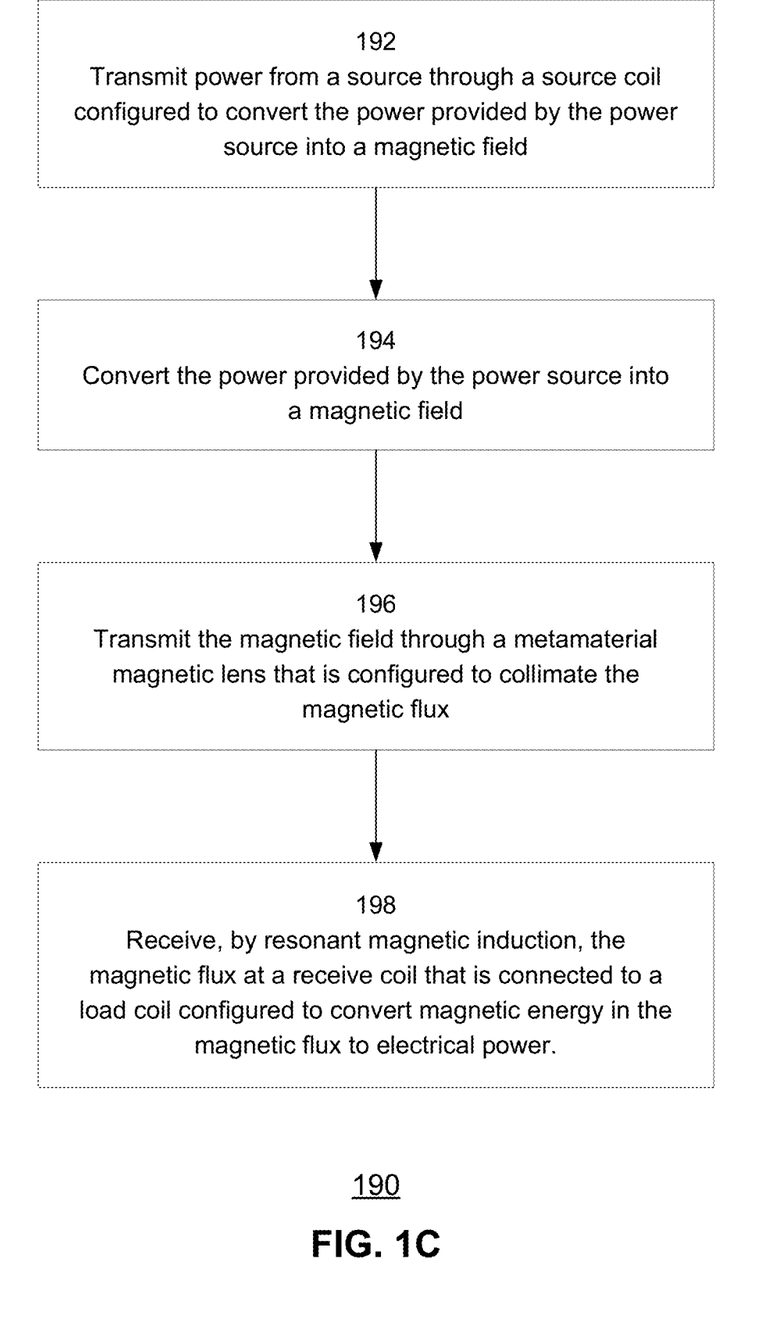
FIG. 1C is a flow chart illustrating an example process for wirelessly transmitting power, in accordance with various aspects of the subject technology.

FIG. 1C is a flow chart illustrating an example process 190 for wirelessly transmitting power, in accordance with various aspects of the subject technology. Although the blocks in process 190 are shown in a particular order, certain blocks may be executed in different orders, at the same time, or with additional blocks. At block 192, power (e.g., electrical energy) may be transmitted from a source through a source coil configured to convert the power provided by the power source into a magnetic field. At block 194, the source coil may couple the magnetic field to a transmit coil. The transmit coil, at block 196, may then transmit the magnetic field through a metamaterial magnetic lens. The magnetic field emitted by the transmit coil may operate at a resonant frequency corresponding to a receiver coil and the metamaterial magnetic lens may be configured, to collimate the magnetic field emitted by the transmit coil. The receiver coil, at block 198, picks up the magnetic flux and couples it to the load coil, which converts the magnetic energy back to electrical power for end usage.

Figure 2A:
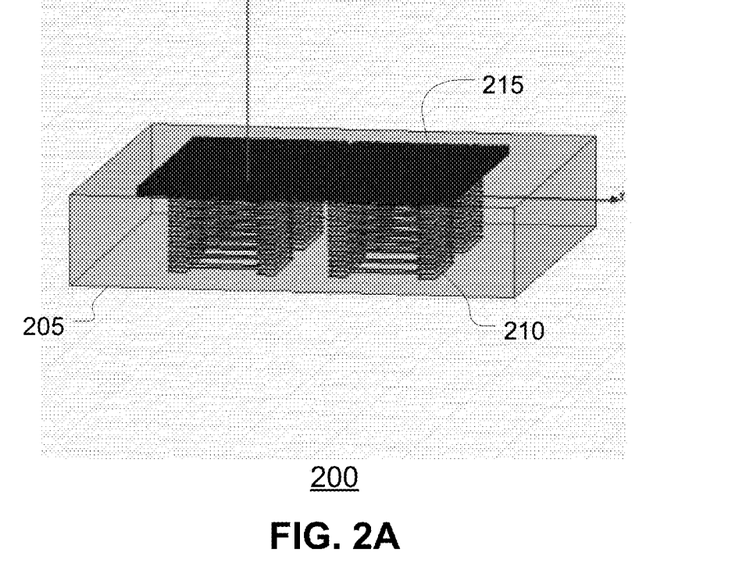
FIGS. 2A and 2B are diagrams illustrating an example transmitter assembly, in accordance with various aspects of the subject technology.
Figure 2B:
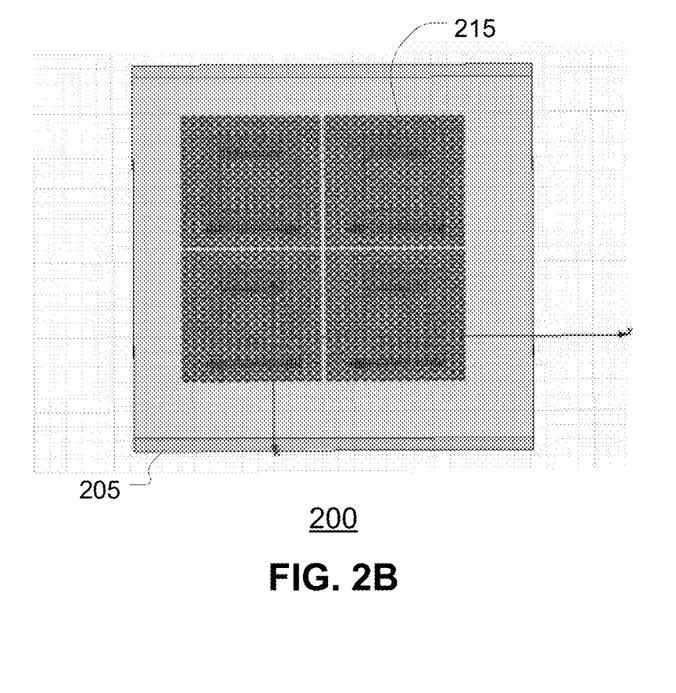

FIGS. 2A and 2B are diagrams illustrating an example transmitter assembly 200, in accordance with various aspects of the subject technology. FIG. 2A shows a side-view of the transmitter assembly, while FIG. 2B shows a top-view of the transmitter assembly. The transmitter assembly 200 illustrated in FIGS. 2A and 2B is a 4-channel transmitter implemented on a printed circuit board (PCB) platform. However, in other aspects of the subject technology the transmitter assembly may be implemented in other forms including, for example, having a different number of channels, being implemented on a different platform, or having a different form.

In FIG. 2A and FIG. 2B, the transmitter assembly is shown with a magnetic lens 215 and a helical coil 210 integrated on a PCB. The helical coil 210 may incorporate both the source coil and the transmit coil and may be implemented using one or more microelectromechanical systems (MEMs) such as MEM varactors or MEM switchable resistors.

Figure 3:
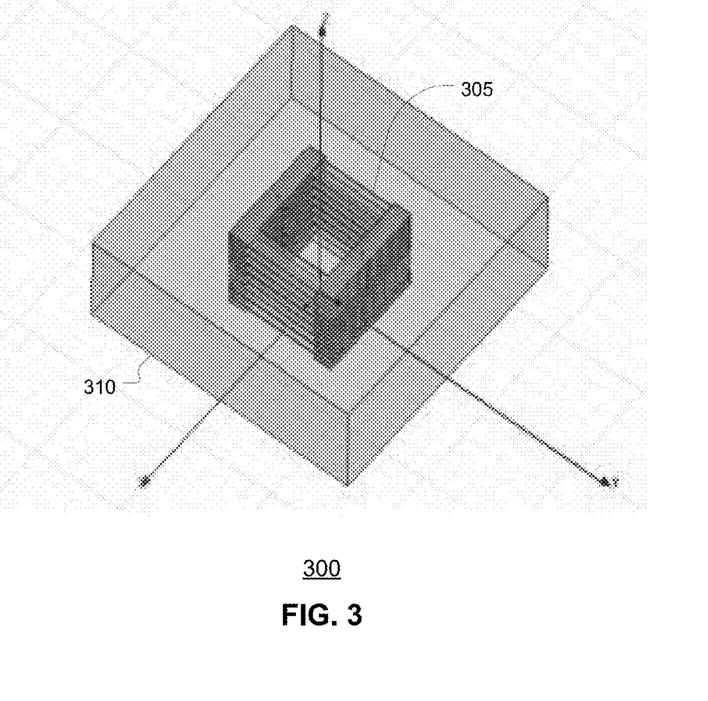
FIG. 3 is a diagram illustrating, an example receiver assembly, in accordance with various aspects of the subject technology.

FIG. 3 is a diagram illustrating an example receiver assembly 300, in accordance with various aspects of the subject technology. The receiver assembly 300 illustrated in FIG. 3 is a single-channel receiver implemented on a PCB platform. However, in other aspects of the subject technology the receiver assembly may be implemented in other forms. The receiver assembly 300 illustrated in FIG. 3 is shown with a helical coil 305 integrated on a PCB 310. The helical coil 305 may incorporate the receive coil and the load coil.

Figure 4A:
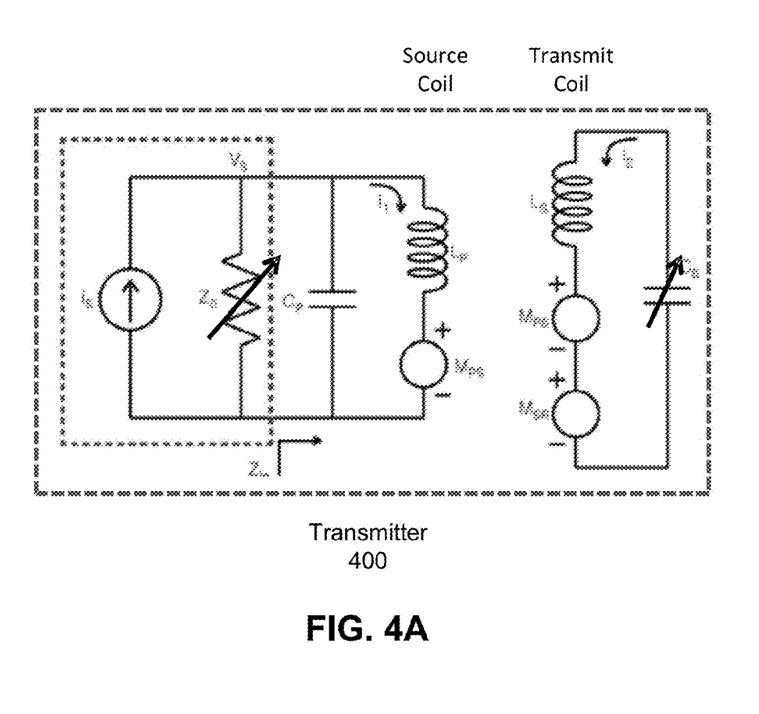
FIGS. 4A and 4B are circuit diagrams illustrating an example transmitter and an example receiver, in accordance with various aspects of the subject technology.
Figure 4B:
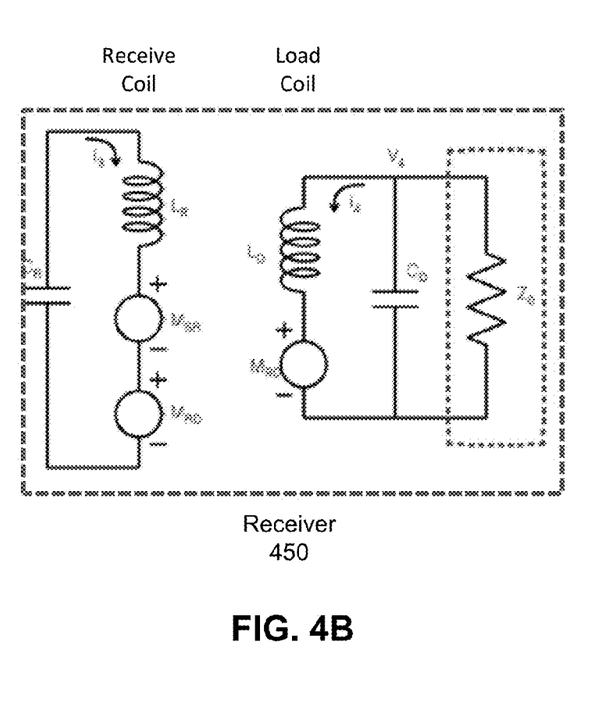

FIGS. 4A and 4B are circuit diagrams illustrating a circuit model for an example transmitter 400 and a circuit model for an example receiver 450, in accordance with various aspects of the subject technology. The circuit models for the transmitter 400 and receiver 450 illustrate the frequency and impedance tuning capability for the transmitter 400 and the receiver 450. The MENU in the transmitter are shown as variable resistors and capacitors.

Based on the circuits shown in FIGS. 4A and 4B, the power transfer efficiency from source to load may be derived, according to one aspect, using, the equation:

$$(1 + \kappa_{12}^2 Q_1 Q_2)(1 + \kappa_{34}^2 Q_3 Q_4) + \kappa_{23}^2 Q_2 Q_3][1 + \kappa_{23}^2 Q_2 Q_3 + \kappa_{34}^2 Q_3 Q_4]) \cdot \frac{Q_4}{Q_L}$$

The equation illustrates the power transfer efficiency for a wireless power transmission system that includes 4 coils: a source coil (coil 1), a transmit coil (coil 2), a receive coil (coil 3), and a load coil (coil 4). The Qs are the quality factors of the coils and Ks are the coupling coefficients between adjacent coils. The equation shows that the power transfer efficiency is a function of quality factors of coils as well as the coupling coefficients of the coils. The coupling, coefficients and quality factors may be solved analytically using any applicable numerical methods.

For example, in one implementation, a coil diameter of 2 inches for all coils may be assumed. The helical spacing may be 18 mils. The coils may be implemented on a substrate laminate layer composed of FR-4 printed circuit board with blind vias connecting coils on adjacent layers. The transmit coil and receive coil may consist of 14 layers each, and the source coil and load coil may consist of 2 layers each. The magnetic lens may consists of a total of 4 laminate layers directly on top of the coils. The magnetic lens, in one aspect, may be configured to operate at 80 MHz, the same frequency at which the coils resonate. The MEMs parameters may be taken from vendor's datasheet. The losses assumed for both MEMs and magnetic lens may be 1 decibel (dB).

Figure 5A:
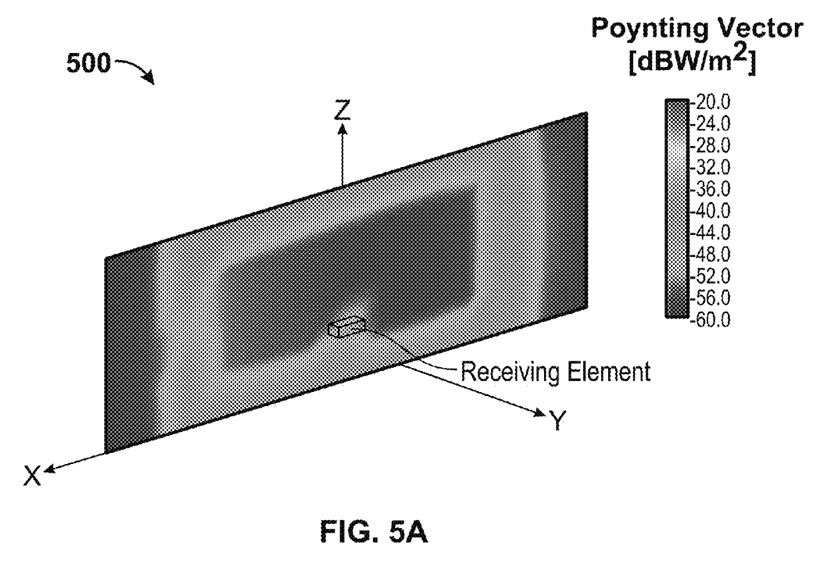
FIGS. 5A and 5B are diagrams illustrating, a simulated magnetic field at a load coil for an example wireless power transmission system without a magnetic lens and a simulated magnetic field at a load coil for an example wireless power transmission system with a magnetic lens, in accordance with various aspects of the subject technology.
Figure 5B:
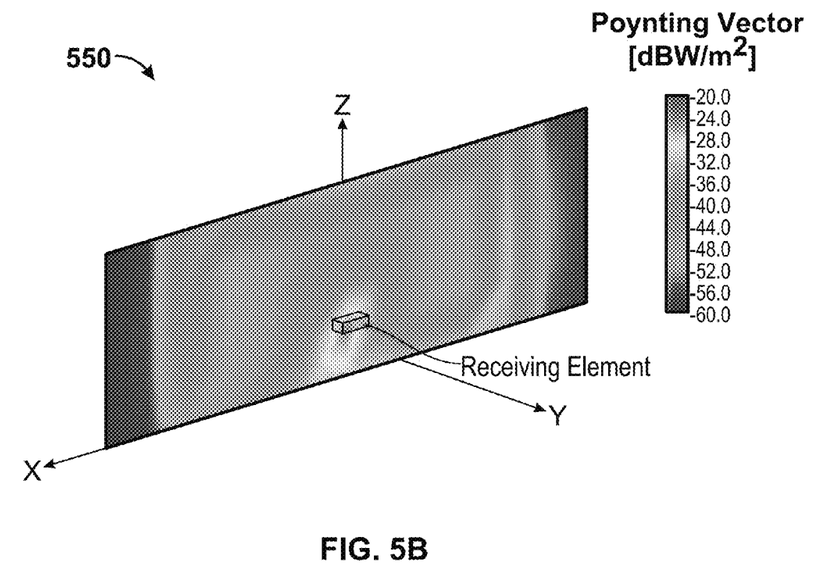

According to aspects of the subject technology, the magnetic lens may increase the efficiency of wireless power transmissions by recovering the evanescent field as well as collimating the magnetic flux emitted from the transmitter. As a result of the increased efficiency, the distance between the transmitter and the receiver may be increased and/or the size of the coils used in the transmitter and receiver may be reduced. FIGS. 5A and 5B are diagrams illustrating a simulated magnetic field 500 at a load coil for an example wireless power transmission system without a magnetic lens and a simulated magnetic field 550 at a load coil for an example wireless power transmission sys with a magnetic lens, in accordance with various aspects of the subject technology.

For both example wireless power transmission systems, the transmitter and the receiver are at a distance of 2 meters apart. Furthermore, the results shown in the diagrams were obtained after the frequency and impedance of the transmitter were matched to those of the receiver. FIG. 5A shows the simulated magnetic field for the load coil in a wireless transmission system without a magnetic lens. In comparison, FIG. 5B shows the simulated magnetic field for the load coil in a wireless transmission system with a magnetic lens. As can be seen in FIG. 5A and FIG. 5B, the efficiency of wireless power transmissions by the wireless power transmission system with the magnetic lens is greater than that of the wireless power transmission system without the magnetic lens.

Figure 6:
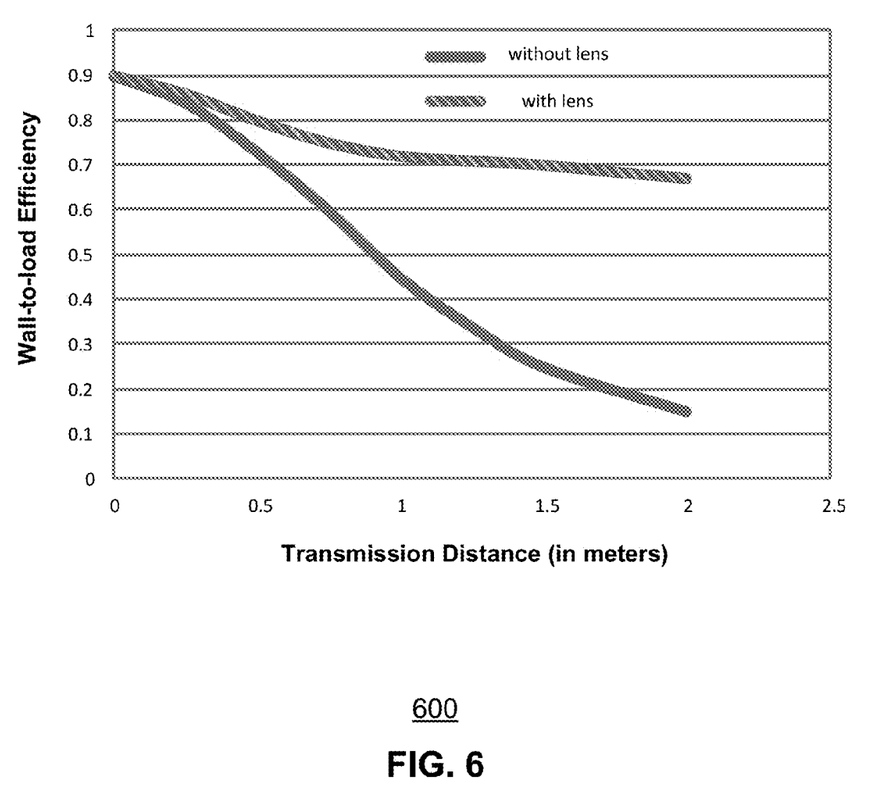
FIG. 6 is a chart comparing the wall-to-load efficiency as a function of transmission distance of an example wireless power transmission system without a magnetic lens and an example wireless power transmission system with a magnetic lens, in accordance with various aspects of the subject technology.

To illustrate another way. FIG. 6 is a chart 600 comparing the wall-to-load efficiency of an example wireless power transmission system without a magnetic lens and an example wireless power transmission system with a magnetic lens, in accordance with various aspects of the subject technology. As can be seen in the chart 600, the wireless power transmission system with the lens does not suffer the same drop in wall-to-load efficiency as the system without the lens as the transmission distance between the transmitter and the receiver increases. According to some aspects, a stronger magnetic field may be observed at the load coil with the lens (e.g., around 10 times stronger). For example, a transmission distance of 1.5 meters results in a wall-to-load efficiency of ~0.25 for a power transmission system without a magnetic lens and a wall-to-load efficiency of ~0.7 for a power transmission system with a magnetic lens. As seen in chart 600, the lens may significantly improve power transmission efficiency to, for example, over 50% at 5 m distance.

Figure 7A:
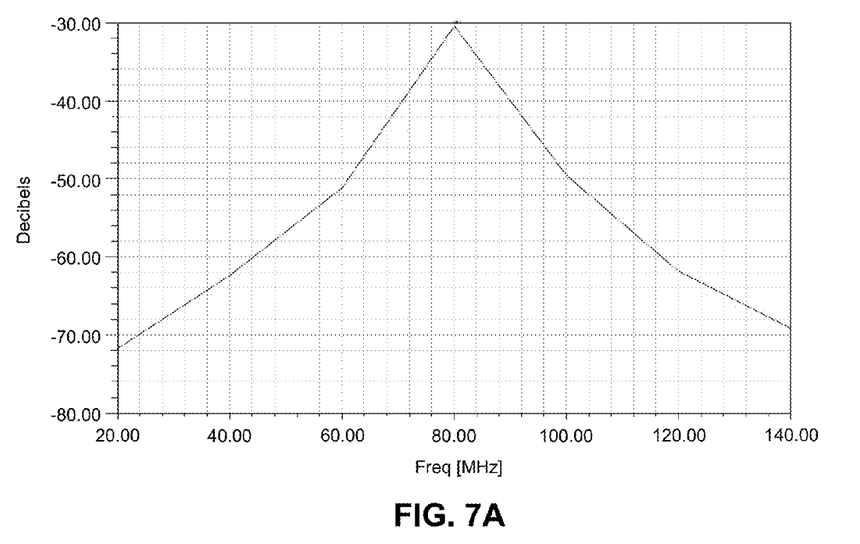
FIGS. 7A and 7B are charts showing the power transmission efficiency at 5 m transmission distance for an example wireless power transmission system without a magnetic lens and with a magnetic lens, in accordance with various aspects of the subject technology.
Figure 7B:
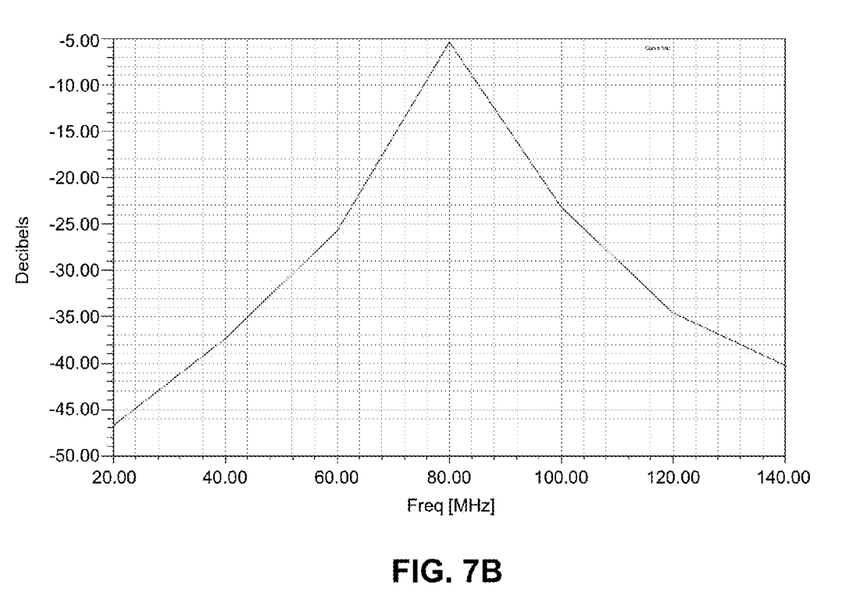

FIGS. 7A and 7B are charts showing the power transmission for an example wireless power transmission system without a magnetic lens and with a magnetic lens, in accordance with various aspects of the subject technology. The charts plot the power transmission of the wireless power transmission system over a distance of 5 meters. The wireless power transmission system may be configured with the following design parameters:

| Design parameters | Value |
| --- | --- |
| resonance frequency (MHz) | 80 |
| Coil dimension (inch) | 2 × 2 |
| pitch spacing (mil) | 18 |
| number of coils (transmit) | 14 |
| number of coils (receive) | 14 |
| PCB materials | FR4 |
| Transmit PCB thickness (cm) | 1.1 |
| Receive PCB thickness (cm) | 1.1 |
| Transmit coil impedance (ohm) | 50 |
| Transmit coil inductance (nH) | 1 |
| Transmit coil capacitance (pF) | 0.4 |
| Receiving coil impedance (ohm) | 50 |
| Receiving coil inductance (nH) | 1 |
| Receiving coil capacitance (pF) | 0.4 |

The chart in FIG. 7A shows the power transmission fir the wireless power transmission system without a magnetic lens, while FIG. 7B shows the power transmission for the wireless power transmission system with a magnetic lens. As can be seen, the power being transmitted is greater when the wireless power transmission system incorporates the magnetic lens. For example, at 80 MHz, the power transmission for the wireless power transmission system without a magnetic lens shown in FIG. 7A reaches almost −30 decibels while the power transmission for the wireless power transmission system with a magnetic lens shown in FIG. 7B reaches almost −5 decibels. The power transmission for other frequencies is also greater for the power transmission system with the magnetic lens than for the power transmission system without the magnetic lens. For transmission distances longer than 5 meters, the efficiency may be seen to drop-off at a slower rate with the magnetic lens present as compared to the wireless power transmission system with no lens. Further aspects of the subject technology may incorporate optimizations on the magnetic lens design to achieve even better field collimations.

Figure 8:
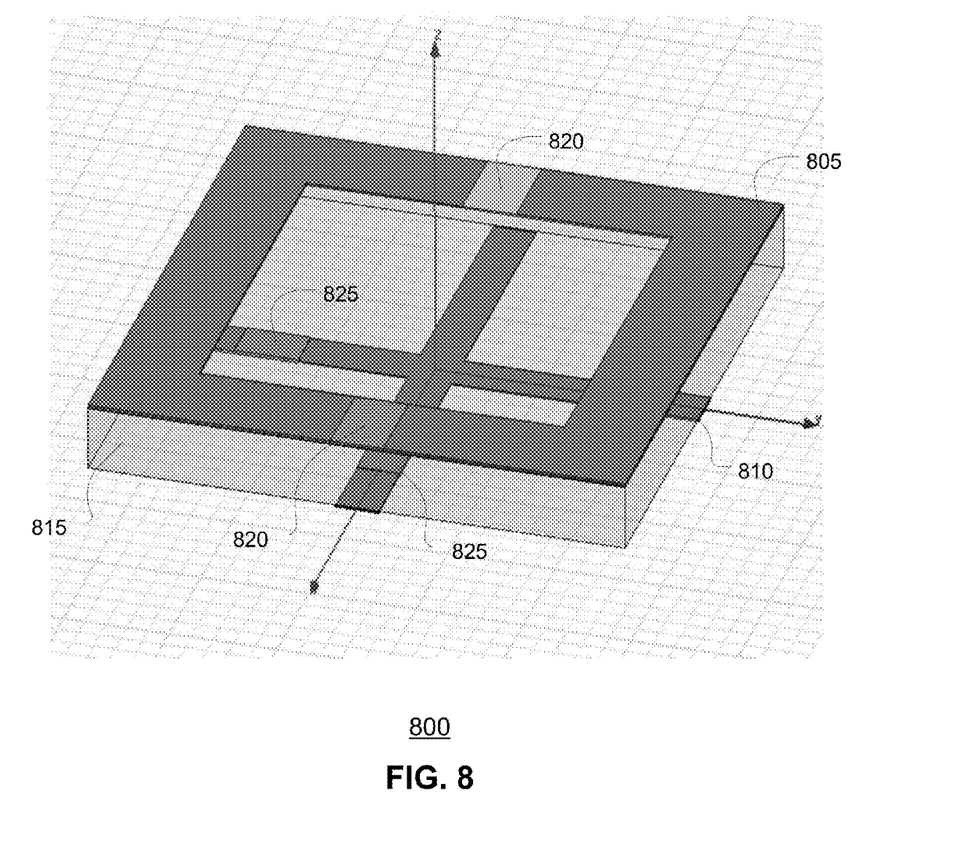
FIG. 8 is a diagram illustrating an example unit cell structure of a metamaterial lens, in accordance with various aspects of the subject technology.

According to various aspects of the subject technology, the magnetic lens used in the wireless power transmission system may be a planar structure. The planar structure may be made of for example, metamaterials or transformational materials implemented on a PCB substrate, however, other types of substrate may also be used. The magnetic lens may also contain one or more unit cell structures which can help give the magnetic lens its properties (e.g., the metamaterial magnetic lens may have an index of refraction of n=−1). The unit cell structures may be arranged in a superlattice configuration of one or more layers and each layer may include a number of unit cell structures. However other arrangements (e.g., other periodic patterns) of unit cell structures may also be used. Furthermore, the unit cell structures themselves may come in various forms. FIG. 8 helps illustrate one example unit cell structure.

FIG. 8 is a diagram illustrating an example unit cell structure 800, in accordance with various aspects of the subject technology. The unit cell structure 800 may include a top layer 805 and a bottom layer 810 implemented on a PCB substrate 815. The top and bottom layers 805 and 810 may be made of, for example, a metal such as copper or any other conductive material. The top layer 805 may be in the form of a split-ring resonator. The split-ring resonator may appear as a loop with one or more slits cut into the loop, in FIG. 8, the loop contains two slits 820. Although different shapes may be used, in FIG. 8, the split-ring resonator is shown as being a square or rectangular shape. According to some aspects, the split-ring resonator may be configured to have a magnetic permeability of $\mu=-1$.

The bottom layer 810 may be in the form of a cross-wire structure. The cross-wire structure may also have one or more slits cut into it. For example, in FIG. 8, the cross-wire structure contains two slits 825. According to some aspects, the cross-wire structure may be configured to have a dielectric permittivity of $\in=-1$. The combination of the top layer 805 and the bottom layer 810 in the unit cell structure 800 may yield $\in=\mu=1$ simultaneously over the same frequency range. Accordingly, the unit cell structure 800 can have an index of refraction of n=-1. Furthermore, the unit cell structure 800 can be optimized and tunable.

According to some aspects, the unit cell structure 800 may be configured using a process that involves configuring (e.g., tuning) the split-ring resonator of the top layer 805 to have a magnetic permeability of $\mu=-1$ at 80 MHz. The tuning of the magnetic permeability may be achieved through tuning split-ring resonator parameters such as, for example, ring dimension, gap capacitance, and ring inductance. The cross-wire structure of the bottom layer 805 may also be configured (e.g., tuned) to have a dielectric permittivity of $\in=-1$ at 80 MHz. The tuning of the dielectric permittivity of the cross-wire structure may be achieved through tuning cross-wire parameters such as, for example, wire spacing and wire diameter.

After the split-ring resonator and the cross-wire structure are individually tuned, the split-ring resonator and the cross-wire structure may be combined to form the unit cell structure 800. The resulting magnetic permeability ($\mu$) and dielectric permittivity ($\in$) of the combined unit cell structure 800 may then be simulated. Although split-ring resonator and cross-wire structure are individually tuned to yield a magnetic permeability of $\mu=-1$ and a dielectric permittivity of $\in=-1$ respectively, according to some aspects, the combined structure may not have a magnetic permeability of $\mu=-1$ and a dielectric permittivity of $\in=-1$ at the same frequency. This is because the split-ring resonator may interact with the cross-wire structure electromagnetically when they are placed in close proximity near each other. The mutual interactions between the split-ring resonators and cross wire structures will shift the magnetic permeability ($\mu$) and dielectric permittivity ($\in$) response and cause both parameters to deviate slightly from -1 at the target frequency.

Accordingly, fine tuning of both structures in the combined unit cell structure 800 may be done to realign both the magnetic permeability ($\mu$) and the dielectric permittivity ($\in$) response to $\in=\mu=-1$ such that an index of refraction of n=-1 can be obtained for the combined unit cell. After the index of refraction of n=-1 is achieved, the wilt cell structure 800 can be implemented on a multi-layer PCB structure. The properties for the multi-layer PCB structure may be verified again before the multi-layer PCB structure is integrated into another PCB structure where one or more transmitter coils reside.

Figure 9:
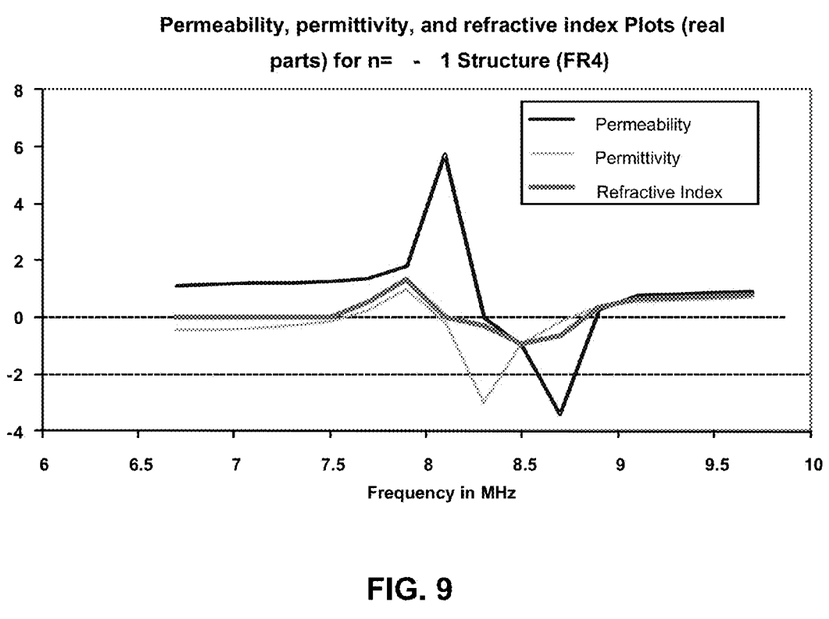
FIG. 9 is a chart illustrating the magnetic permeability and dielectric permittivity characteristics for an example metamaterial magnetic lens, in accordance with various aspects of the subject technology.

FIG. 9 is a chart illustrating the magnetic permeability and dielectric permittivity characteristics for an example metamaterial magnetic lens, in accordance with various aspects of the subject technology. As can be seen in the chart, a refractive index of n=-1 may be achieved at a target frequency.

Accordingly, the magnetic lens may enable the wireless power transmission system to extend the range of emitted magnetic fields by, for example, several orders of magnitude by recovering and collimating near-field evanescent magnetic flux. By doing so, the transmission efficiency may be greatly enhanced at extended distances and the coils used in the transmitter and/or the receiver may be reduced in size (thereby allowing, portable devices to be more compact). In addition, the MEM switchable resistors and MEM varactors used in the coils may enable matching of frequency and impedance between source and load to further optimize efficiency. According to one aspect, some or all of the components in the design are compatible with the PCB platform and are also scalable for multiple transmission channels to simultaneously power multiple devices yet at very compact sizes.

Figure 10:
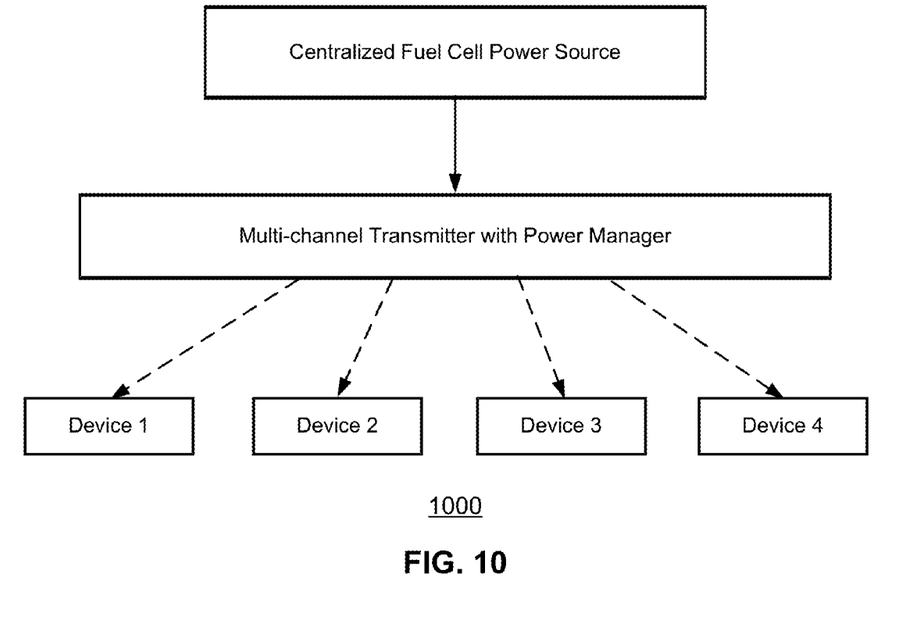
FIG. 10 is a block diagram illustrating an example wireless power distribution infrastructure, in accordance with various aspects of the subject technology.

For example, FIG. 10 is a block diagram illustrating an example wireless power distribution infrastructure 1000, in accordance with various aspects of the subject technology. The wireless power distribution infrastructure may use a high capability fuel cell as a centralized power source. The fuel cell may be mounted to a person or a vehicle or placed in a pocket or backpack. The fuel cell may be connected to a multi-channel transmitter such as the transmitter of the wireless power transmission system described above and the multi-channel transmitter may operate at a set of frequencies corresponding to a number of receivers.

The transmitter may wirelessly power all of the mobile electronic devices (e.g., devices 1-4) on or around the person or vehicle carrying the fuel cell, such as radios, GPS units, and cell phones. In one aspect, the mobile electronic devices may not contain any rechargeable batteries and are powered directly by the fuel cell in a continuous manner. In another aspect, the mobile devices may have rechargeable batteries built-in and a central fuel cell may either simultaneously or sequentially charge the batteries.

Assuming that a charging profile varies from one device to another, all devices may be operated simultaneously and seamlessly by implementing a charging-on-demand process. In that process, a software-based power manager may be configured to charge a particular device upon receiving a low power signal from that device's sensor. The sensor signal may be in the form of a Bluetooth or other low frequency signal. The power manager may be implemented a part of the multi-channel transmitter or as a separate module which may communicate with the transmitter via a wire or wirelessly.

According to one aspect, the wireless power transmission may not be a line-of-sight process. Variations may also exist for different transmission paths, and choosing, the channels with a more efficient path for a particular device may be desirable. To accomplish that, a central controller may be implemented at the transmitter to monitor the power flow of each channel and switch channels as needed for the improved transmission efficiency and power level for each device. The central controller may, according to one aspect, consist of field-programmable gate array (FPGA) logic blocks and analog electronics to enable real-time agile power system management.

In other aspects, the central high capacity power source can be a series of distributed power nodes connected to standard power grids throughout a metropolitan area. A person may be able to wirelessly re-charge or power his mobile devices or electric cars at the vicinity of any node. According to one aspect, the power-node network may be very similar to a cellular data network except that it is for power transmission, not data.

According to some aspects, wireless power transmission system disclosed herein may be capable of displacing current cable based power distribution systems, which are cumbersome and inflexible. The surge in the use of handheld electronic devices increases demand for portable power distribution solutions such as the one provided by the wireless power transmission system. The wireless power transmission system may be used in, for example, commercial, military, and defense applications, such as to power portable electronics carried on the battlefield or, in space applications, to power a constellation of fractionated satellites. The subject technology ma also be used in various markets, including for example and without limitation, battery and power markets, power transfer markets, wireless power markets, and wireless charging markets.

The description of the subject technology is provided to enable any person skilled in the art to practice the various embodiments described herein. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments will be readily apparent to those skilled in the art, and generic principles defined herein may be applied to other embodiments. Thus, many changes and modifications may be made to the subject technology, by one having ordinary skill in the art, without departing from the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing, disclosed herein is intended to be dedicated to the public regardless of whether such disclosure is explicitly recited in the above description.

What is claimed is:

1. A system for wireless power transmission, the system comprising:
    a source coil configured to convert power provided by a power source into a magnetic field;
    a metamaterial magnetic lens comprising a plurality of unit cell structures arranged in a superlattice, each unit cell structure of the plurality of unit cell structures comprising a split-ring resonator; and
    at least one transmit coil, coupled to the source coil, configured to transmit the magnetic field through the metamaterial magnetic lens, wherein the magnetic field exhibits a magnetic flux,
    wherein the metamaterial magnetic lens is configured to collimate the magnetic flux of the magnetic field transmitted by the at least one transmit coil towards a receiver of a load.

2. The system of claim 1, wherein the metamaterial magnetic lens has a refractive index of −1.

3. The system of claim 1, wherein the split-ring resonator is configured to have a magnetic permeability of −1.

4. The system of claim 1, wherein each unit cell structure comprises a cross-wire structure comprising two slits.

5. The system of claim 4, wherein the cross-wire structure is configured to have a dielectric permittivity of −1.

6. The system of claim 1, wherein the source coil comprises at least one microelectromechanical (MEM) switchable resistor configured to provide impedance matching between the power source and a load.

7. The system of claim 1, wherein each of the at least one transmit coil comprises at least one microelectromechanical (MEM) varactor configured to tune a resonance frequency of at least one transmit coil to match that of at least one receive coil.

8. The system of claim 1, wherein the at least one transmit coil and the metamaterial magnetic lens are implemented on a printed circuit board (PCB) substrate.

9. The system of claim 1, wherein the system is configured to operate with a receiver comprising at least one receive coil coupled with a load coil to convert the magnetic field back to electrical power to be used by the load, wherein the magnetic field transmitted by the at least one transmit coil is able to wirelessly induce a current in the at least one receiver coil.

10. A method for wirelessly transmitting power, the method comprising:
    transmitting power from a source through a source coil configured to convert the power provided by the power source into a magnetic field;
    converting, at the source coil, the power into a magnetic field; and
    using a transmit coil to transmit the magnetic field through a metamaterial magnetic lens comprising a plurality of unit cell structures arranged in a superlattice, each unit cell structure of the plurality of unit cell structures comprising a split-ring resonator,
    wherein the magnetic field is transmitted at a resonance frequency of the transmit coil and the resonance frequency of the transmit coil is configured to correspond to that of a receive coil, and
    wherein the metamaterial magnetic lens is configured to collimate the magnetic field transmitted by the transmit coil towards the receiver coil.

11. The method of claim 10, wherein the metamaterial magnetic lens has a refractive index of −1.

12. The method of claim 10, further comprising using a receive coil to receive the magnetic field, wherein the receive coil is coupled to a load coil to convert magnetic energy of the magnetic field to electrical power.

13. A system for wireless power transmission, the system comprising:
    a source coil configured to convert the electrical energy into a magnetic field;

a transmit coil, coupled to the source coil, configured to transmit the magnetic field wherein the magnetic field exhibits a magnetic flux; and a metamaterial magnetic lens comprising a plurality of unit cell structures arranged in a superlattice, each unit cell structure of the plurality of unit cell structures comprising a split-ring resonator, wherein the metamaterial magnetic lens is configured to collimate the magnetic flux of the magnetic field transmitted by the transmit coil.

14. The system of claim 13, further comprising:

a power source configured to provide the electrical energy, wherein the system is configured to operate with a receiver a receive coil coupled to a load coil, the receive coil configured to receive the magnetic flux and convert the magnetic energy back to electrical energy, and wherein the receive coil and the load coil are implemented on a printed circuit board (PCB) substrate.

15. The system of claim 13, wherein the metamaterial magnetic lens has a refractive index of −1.

16. The system of claim 13, wherein each split-ring resonator has a magnetic permeability of −1 and a cross-wire structure having a dielectric permittivity of −1.

17. The system of claim 16, wherein the split-ring resonator and the cross-wire structure are made of copper, and wherein the split-ring resonator is square shaped.

18. The system of claim 13, wherein the source coil, the transmit coil, and the metamaterial magnetic lens are implemented on a printed circuit board (PCB) substrate.

* * * * *